United States Patent [19]

Crookshanks

[11] 4,239,981
[45] Dec. 16, 1980

[54] FAST SEMICONDUCTOR DIGITAL LOGIC INVERTER GATE

[75] Inventor: Rex J. Crookshanks, Palos Verdes Estates, Calif.

[73] Assignee: Ampex Corporation, Redwood City, Calif.

[21] Appl. No.: 945,629

[22] Filed: Sep. 25, 1978

Related U.S. Application Data

[63] Continuation of Ser. No. 760,514, Jan. 19, 1977, abandoned.

[51] Int. Cl.³ .................... H03K 19/20; H03K 19/177
[52] U.S. Cl. .................................... 307/214; 307/213; 307/237; 307/303
[58] Field of Search ............... 307/207, 213, 214, 218, 307/237, 303, 317 A

[56] References Cited

U.S. PATENT DOCUMENTS

| | | | |
|---|---|---|---|
| 3,962,590 | 6/1976 | Kane et al. | 307/214 |
| 4,009,397 | 2/1977 | Mulder et al. | 307/214 X |

OTHER PUBLICATIONS

W. J. Nestork, "High-Speed Logic Circuit", IBM Technical Disclosure Bulletin, vol. 4, No. 8, Jan. 1962, pp. 41-42.
W. Mayeda, "Logical Circuit", IBM Technical Disclosure Bulletin, vol. 3, No. 10, Mar. 1961, p. 76.

*Primary Examiner*—John Zazworsky
*Attorney, Agent, or Firm*—Fraser and Bogucki

[57] ABSTRACT

An extremely fast, highly regulated and nonresistive semiconductor digital logic inverter gate which is suitable for use as a fundamental building block in an uncommitted gate array includes an input conductor, at least one output conductor, a first current source providing a fixed current of a given magnitude to the input conductor, a second current source providing a current varying exponentially with input voltage to each output conductor, and a current control circuit operating in response to current flow through the input conductor to control the magnitude of current provided by the second source of current to each of the output conductors at a magnitude greater than the first magnitude or at a nonzero magnitude substantially less than the first magnitude. Subnanosecond time delays in switching between digital logic states are attained by constructing the logic gate as an integrated circuit from Schottky diodes which have very little transit time delay and bipolar transistors which are never biased into either saturation or cutoff. Capacitance charging time is minimized by utilizing a small difference in forward bias voltage drops across different kinds of Schottky diodes to clamp digital logic voltage swings at approximately 133 millivolts or less. Because of its exponential voltage current relationship this voltage differential applied across the base emitter terminals of a transistor utilized in the second current source is sufficient to provide current differentials greater than 100:1 for maintenance of a good noise margin.

33 Claims, 7 Drawing Figures

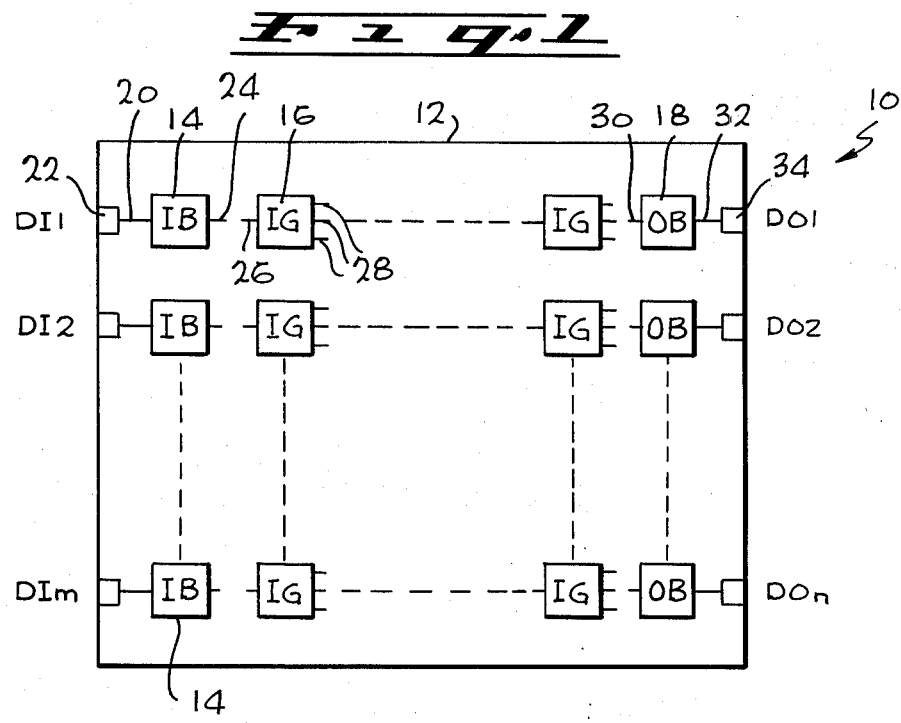
Fig. 1
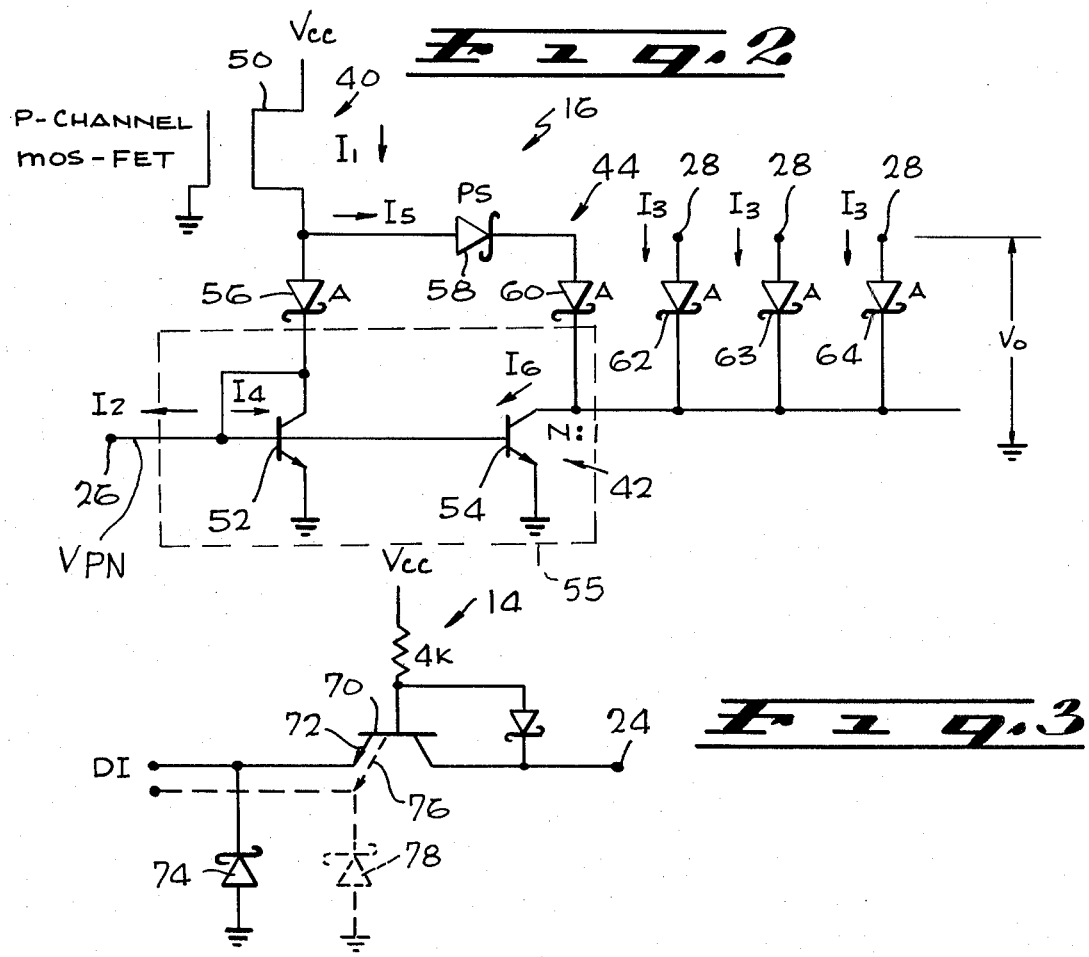
Fig. 2
Fig. 3

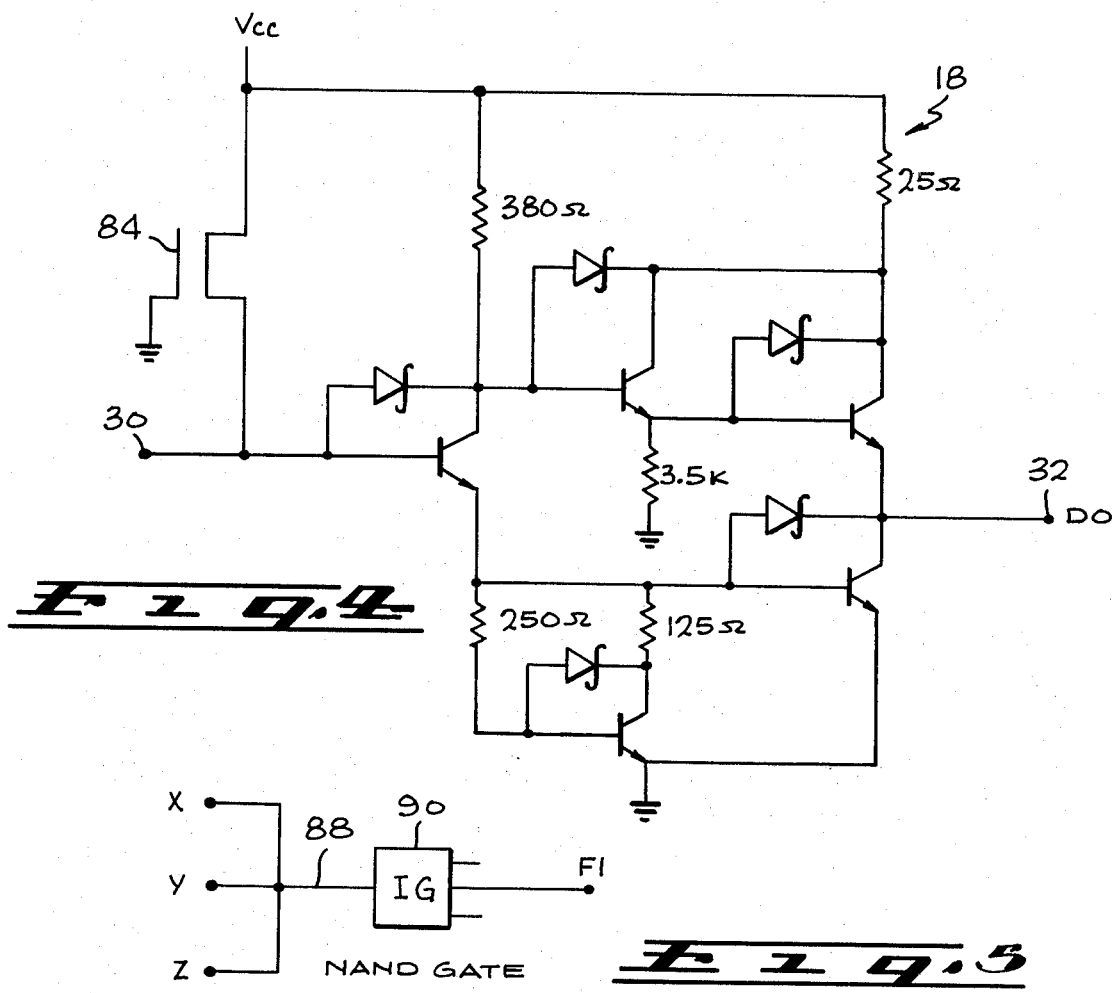
Fig. 4
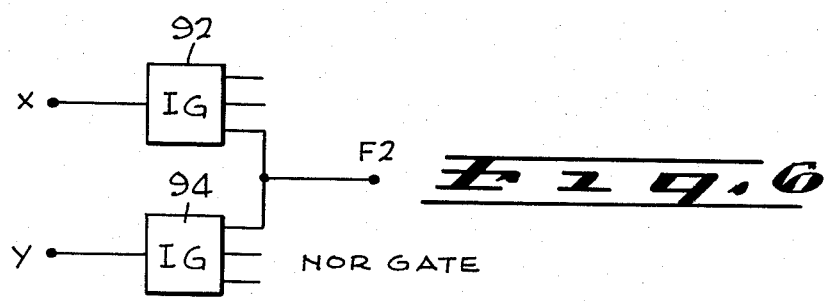
Fig. 5
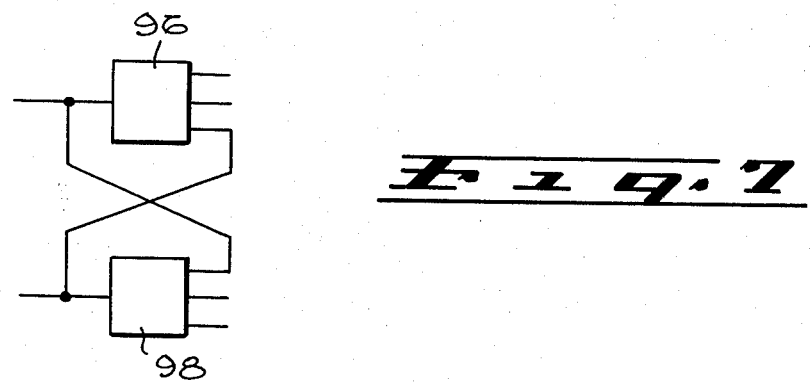
Fig. 6
Fig. 7

FAST SEMICONDUCTOR DIGITAL LOGIC INVERTER GATE

CROSS REFERENCE TO RELATED APPLICATION

This application is a continuation of application Ser. No. 760,514 filed Jan. 19, 1977, now abandoned, by Rex John Crookshanks for FAST SEMICONDUCTOR DIGITAL LOGIC INVERTER GATE.

BACKGROUND OF THE INVENTION

1. Field of the Invention

This invention relates to binary digital logic inverter gates and particularly to extremely high speed logic inverter gates which may be fabricated as arrays of 500 or more gates on a single integrated circuit chip.

2. Description of the Prior Art

Present day digital logic circuits are manufactured from logic modules which are selected to perform a desired logic function and then connected to other logic modules to form a desired logic circuit. A logic module typically includes an external package having a plurality of sturdy external leads that may be connected to a printed circuit board or other type of conductor for communication with the external leads of a similar logic module. Secured within the external package of the logic module is a semiconductor chip containing the transistors, diodes and other circuit components that are required to perform the logic functions of the logic module. Tiny wires connect terminal pads on the semiconductor chip with the external leads of the logic module to permit electrical communication between the logic chips of different logic modules. The logic circuitry of each semiconductor chip is in turn formed from standard logic blocks or gates of which the inverter gate is usually the basic logical building block. In some types of digital logic circuitry, inverter gates are selectively combined to form NAND gates, NOR gates or more complex standard logic gates, while in others a single inverter gate may be modified to form one or more of these gates. Such circuits typically provide relatively large voltage swings between different logic levels to provide good noise immunity for interchip communication. However, because inherent chip capacitances must charge through these large voltage swings, relatively large time delays of several nanoseconds or relatively large currents are consumed by the gate circuits. As logic functions have become more and more complex, they have been constructed by placing more and more standard logic circuits on each semiconductor chip. This technique fails to recognize the fact that only logic gates that are in communication with other chips need a high noise immunity. Very little noise is encountered by circuitry that is connected solely within a single chip. Voltage swings below 0.5 volt and of 0.133 volt or less become possible where only intrachip circuit connections are encountered.

SUMMARY OF THE INVENTION

A high speed current controlled digital logic inverter gate in accordance with the invention includes a gate input conductor, at least one gate output conductor, a first source of current of a first magnitude coupled to provide current therefrom to the input conductor and to a current control circuit, a controllable conductor of current providing a second source of current coupled to provide current at each output conductor of a polarity opposite the polarity of current provided to the input conductor and thus away from the output conductor, and a current control circuit operating in response to current flow through the input conductor to control the magnitude of current provided by the controllable conductor of current to selectively maintain the current at each output at either a high level substantially equal to or greater than the first magnitude or at a nonzero low level substantially less than the first magnitude.

In a particular embodiment of the invention, the first current source may be implemented as a "P" channel MOS-FET transistor with a grounded gate electrode and the second current source may be implemented as a type of circuit commonly known as a Wilson current generator. Aluminum and platinum silicide Schottky diodes are utilized in the current control circuit to bias the Wilson current generator for either a high level or a low level output current. To minimize capacitance charging times, logic voltage swings are limited to an extremely small voltage difference precisely determined by and equal to the difference between the forward biased voltage drops across two different kinds of Schottky diodes. For aluminum diodes and platinum silicide diodes this difference is approximately 0.133 volts and remains the same throughout a substantial range of temperatures. Because of these extremely small voltage swings between different logic states, the capacitance charging time is extremely short even if small currents are employed. However, because the full logic swing is applied across the base emitter terminals of the output current generator, current magnitude ratios of 100:1 or more can be realized at each gate output for different logic levels to provide excellent noise immunity.

Because of the tremendously high speeds and small physical size of logic inverter gates in accordance with the invention, it becomes practical to provide an uncommitted gate array in the form of a large matrix of inverter gates. A single array may then be interconnected in selected metalization patterns to provide different desired specific logic functions. Economies of mass production are realized by manufacturing a single array of logic gates for a wide variety of logic functions with only the metalization being different to provide different logic functions.

Because of the extremely high operating speeds of logic gates in accordance with this invention, they are subject to interference from extremely high frequency noise. For example, a logic gate having a delay of 0.1 nanosecond or less would respond to noise interference at a frequency of $10 \times 10^9$ hertz or higher. Within a semiconductor chip, conductor lengths seldom exceed several millinches and even high frequency noise pickup by these conductors is not a problem. However, conductor leads which interconnect two different chips typically have a total minimum length of one inch or more. These conductors operate as relatively long antennas for noise signals at the frequencies of interest herein and the magnitude of these noise signals might easily become large with respect to the 0.133 volt logic swings employed herein. Direct coupling of high speed logic gates on different chips thus becomes impractical. However, a logic array in accordance with the present invention is provided with a standard logic family input buffer and output buffer to provide interchip communication.

For example, in a TTL logic system, a logic array in accordance with the invention would have a plurality of TTL input buffers which would receive TTL input logic signals at switching speeds and voltages suitable for interchip communication, an array of high speed digital logic inverters which receive the input signals and provide desired logic output signals in accordance therewith, and a plurality of TTL output buffers which receive the high speed logic output signals and convert them to logical speeds and voltages which are again suitable for communication for interchip communication. A completed gate array in accordance with the invention thus appears as an input buffer providing a finite time delay that might be typically on the order of two nanoseconds, an intermediate high speed complex logic array with a comparatively small time delay therethrough and an output buffer with a time delay that might typically be on the order of three nanoseconds. The completed gate array would thus provide a total delay of approximately five nanoseconds therethrough irrespective of the complexity of the intermediate high speed logic array.

BRIEF DESCRIPTION OF THE DRAWINGS

A better understanding of the invention may be had from a consideration of the following detailed description taken in conjunction with the accompanying drawings in which:

FIG. 1 is a schematic representation of a semiconductor chip in accordance with the invention having fabricated thereon a plurality of input buffers, and intermediate array of high speed inverter gates and a plurality of output buffers;

FIG. 2 is a schematic representation of a high speed inverter gate in accordance with the invention;

FIG. 3 is an input buffer circuit for the uncommitted gate array logic circuit shown in FIG. 1;

FIG. 4 is an output buffer for the uncommitted gate array logic circuit shown in FIG. 1;

FIG. 5 is an illustration of how an inverter circuit in accordance with the invention may be connected to form a NAND gate;

FIG. 6 is a schematic logic diagram illustrating how inverter circuits in accordance with the invention may be coupled to form a NOR gate; and, FIG. 7 is a schematic logic diagram illustrating how inverter circuits in accordance with the invention may be coupled to a flip-flop.

DETAILED DESCRIPTION

As shown in FIG. 1 an uncommitted gate array 10 in accordance with the invention includes a semiconductor chip 12 having fabricated thereon a plurality of identical input buffer logic gates 14, a plurality of identical differential Schottky clamped logic inverter gates 16, and a plurality of output buffer logic gates 18. Each input logic buffer gate 14 has an input conductor 20 connecting the buffer gate 14 with a metalized pad 22 which may receive a fine wire for electrically coupling the pad 22 to an external package lead. Each pad 22 thus corresponds to a different data input signal designated DI1–DIM. For some kinds of input buffer circuits such as TTL, additional input leads may be readily provided for each input buffer circuit 14 with the signals on the additional leads being automatically ANDed by the input gates 14. A single output conductor 24 is provided from each input buffer logic circuit 14 for connection to an input of an inverter gate 16. Each inverter gate 16 has an input conductor 26 and three identical and interchangeable output conductors 28. The number of output conductors may be increased or decreased as desired. Because of their small size, the number of differential Schottky clamped logic inverter gates 16 may be quite large. For example, the gates 16 may form an array of 20 rows by 25 columns for a total of 500 gates. Even larger arrays are clearly feasible.

The output buffer logic gates 18 each have a single input 30 which is responsive to an output from an inverter gate 16 and an output conductor 32 coupling the output buffer circuit 18 to a bonding pad 34 to permit communication with circuitry external to the semiconductor chip 12.

A single uncommitted gate array 10 as shown in FIG. 1 may be manufactured in large volume for a variety of different logic modules. Use of the same array for a variety of different products increases the production volume for the uncommitted gate array and reduces the different inventories that must be carried for different products. The uncommitted gate array 10 may then be selectively metalized with the various input buffers 14, inverter gates 16 and output buffers 18 being selectively interconnected in desired conductor patterns to obtain a variety of different circuit modules.

As shown in FIG. 2, each of the identical differential Schottky clamped logic inverter gates 16 includes a first current source 40 providing a current $I_1$ which varies non-linearly with the output voltages of source 40 and remains substantially constant at a first magnitude, a second current source 42 which includes an NPN transistor 54 which is a controllable conductor of current having a collector coupled to drive each of the three outputs 28 with a current $I_3$ which varies with a base emitter voltage applied to transistor 54, and current control circuitry 44 in the form of Schottky diodes which control the level of current in the second current source 42 in response to an input conductor current $I_2$ to provide output currents $I_3$ of a magnitude which is approximately equal to or greater than the magnitude of current $I_1$ or nonzero but substantially less than the magnitude of the current $I_1$ depending upon the current $I_2$ through the input conductor 26.

The first current source 40 is shown as being advantageously implemented as a "P" channel MOS-FET transistor having a grounded gate electrode and a drain connected to a supply voltage Vcc which might typically be in the range of 2 to 5 volts. It will be assumed herein that Vcc equals 5 volts, although a smaller voltage might be employed for the inverter gates 16 to reduce power consumption. As an alternative to the "P" channel MOS-FET transistor 50, the current source 40 may be manufactured as a large resistor, a lateral PNP transistor or in some other suitable form. The current $I_1$ represents the entire supply current for each gate and hence determines the power dissipation for each gate. Because of the small voltage swings between different logic states for the inverter gate 16, the current $I_1$ can be quite small without causing excessive time delays because of charging of circuit capacitance. A current on the order of 100 microamps or less is sufficient to provide switching time delays between the input 26 and outputs 28 on the order of 0.1 nanosecond or less. In addition to the low differential voltage swings between different logic states, other factors contributing to this high speed are the use of majority carrier Schottky diodes with very little transit time delay, and the operation of bipolar transistor current source 42 in a mode where the transistor is never turned completely off and never saturated. Delays resulting from the switching of current source 42 between different current states are therefore also minimized.

The second current source 42 includes a first diode coupled NPN bipolar transistor 52 and a second NPN bipolar transistor 54. The transistors 52 and 54 are coupled in a combination which is commonly known as a Wilson current generator 55. The collector and base of transistor 52 are connected to each other and also to input conductor 26. The emitter is connected to ground. The base of transistor 54 is connected to the base collector connection of transistor 52 and the emitter of transistor 54 is connected to ground. The collector of transistor 54 is coupled through the current control circuitry 44 to the output conductors 28.

With the bases and emitters of transistors 52 and 54 connected directly in parallel as shown in FIG. 2, it is well known that if the transistors are fabricated at the same time in close proximity to each other on the same semiconductor chip with the same processes, the ratio of currents through the emitters of the two transistors will be directly proportional to the ratio of their respective emitter areas. Thus, if the emitter area of transistor 42 is N times larger than the emitter area of transistor 52, the emitter current of transistor 54 will be N times larger than the emitter current of transistor 52. This current ratio of N to 1 determines the fanout of the inverter gate 16. To assure proper high speed operation, the total number of inverter gate inputs to which the output conductors 28 of inverter gate 16 are connected should be somewhat less than N. If N is selected to be in the range of 7 to 10, each of the three output conductors 28 could be coupled to two subsequent input stages for a total fanout of 6 to 1. The fanout can of course be varied to suit the particular needs of any given circuit configurations.

The current control circuitry 44 is formed from two different kinds of Schottky diodes. Aluminum Schottky diodes designated A have a forward biased voltage drop across them of $V_A = 0.350$ volt while platinum silicide Schottky diodes are designated PS and have a forward biased voltage drop thereacross of a magnitude $V_{PS} = 0.483$ volt. The transistors 52 and 54 have a bipolar PN junction extending between their base and emitter terminals with a forward biased voltage drop thereacross of magnitude $V_{PN} = 0.600$ volt.

The current control circuit 44 is formed with an aluminum Schottky diode 56 connected to conduct current from the current source 40 to the base collector connection of transistor 52 and the base of transistor 54. A platinum silicide Schottky diode 58 and an aluminum Schottky diode 60 are connected in series to conduct current from current sources $I_1$ at the source FET 50 to the collector of transistor 54. While not critical to the operation of the invention, fabrication advantages may be realized by disposing diode 58 adjacent the current source 40 and an anode of diode 56 while disposing aluminum Schottky diode 60 adjacent the collector of transistor 54. Aluminum Schottky diodes 62, 63 and 64 are each fabricated with their cathodes connected to the collector of transistor 54 and their anodes each connected to a different output conductor 28.

In observing the operation of the differential Schottky clamped logic inverter gate 16 shown in FIG. 2, it will be apparent that if no current $I_2$ flows through the input conductor 26, the current $I_1$ will divide through two current paths and flow partially through diode 56 and partially through series connected diodes 58 and 60. The current flowing through diode 56 will divide between the diode connected transistors 52 and the base of transistor 54. If base emitter voltage $V_{PN}$ increases slightly, the base current in transistor 54 also increases and because of the transistor current gain, the collector current of transistor 54 must increase even more. More current will thus flow through the current path of diodes 58 and 60 to reduce the base current available to transistor 54 and compensate for the previous increase in base emitter voltage and base current through transistor 54. The voltage $V_{PN}$ is thus quite closely regulated and modest changes in the magnitude of current $I_2$ do not appreciably affect the voltage $V_{PN}$. The current control circuit 44 thus operates in combination with the second current source 42 to effectively clamp the voltage at input conductor 26 at a maximum value of $V_{PN}$.

With the transistor 54 conducting as described above, each of the output conductors 28 will be clamped (limited) at a maximum voltage equal to the sum of the forward biased voltage drops across the PN base emitter junctions of transistors 52, 54, across diode 56, across diode 58, across diode 60 and across one of the diodes 62, 63 or 64. The clamped (limited) maximum output voltage can thus be calculated as $$V_O = V_{PN} + V_A - V_{PS} - V_A + V_A \qquad (1)$$

$$V_O = V_{PN} - V_{PS} + V_A \qquad (2)$$

Since the forward biased voltage drop across a platinum silicide Schottky diode is 133 milivolts greater than the forward biased voltage drop across an aluminum Schottky diode, $-V_{PS} + V_A = -0.133$ and $V_O = V_{PN} - 0.133$. Thus, when an output 28 is connected to an input 26 of a subsequent inverter gate 16, the output 28 clamps the connected input terminals at a maxium voltage of $V_{PN} - 0.133$ while the subsequent input clamps (limits) the connected output terminal at a maximum voltage of $V_{PN}$. The total voltage swing between different logic states is therefore limited to 0.133 volts.

Each inverter gate 16 provides a tremendously high degree of self regulation of operating voltages and currents and additional regulation results from the interconnection of identical gates. Much of the stability of operation and regulation of an array 10 derives from the integrated circuit processing techniques whereby all similar elements of an array 10 are fabricated in the same way at the same time in very close proximity to one another. As a result, any variations in operation characteristics of one element during fabrication or later operation are equally reflected in all such elements to permit inter-element compensation when the elements are coupled together.

Substantial negative feedback provides great stability of regulation for each gate 16. For example, when the input 26 is low and the outputs 28 are high, the input 26 is clamped at a voltage of approximately 0.467 volts by an output of a preceding identical stage which is designed to sink as much current $I_2$ as gate 16 can supply at the clamping voltage.

Under these conditions current $I_1$ is divided with a small, but carefully regulated current passing through diode 58, diode 60 and then through the collector of transistor 54 to ground. The remaining portion of current $I_1$ passes through diode 56 to be again divided with most becoming current $I_2$ and only a small portion of current $I_1$ reaches transistors 52 and 54 which operate as a regulated current amplifier to provide a transistor 54 collector current $I_6$ which is a predetermined multiple of current $I_4$, for example 4:1.

The transistor 52 provides a first source of regulating feedback in the manner typical of a Wilson current generator. For example, if the current gains of particular transistors 52, 54 are higher than average, the collector of transistor 52 conducts more of current $I_4$ and less is available to the base of transistor 54 to compensate for the higher gain.

The current $I_4$, and hence current $I_6$, varies exponentially with the voltage at input 26. Since the output current varies exponentially with input voltage and since the capacitance of the output and input of any succeeding stages coupled thereto charges linearly with current, the output voltage tends to change exponentially with input voltage when switching between states. This nonlinear exponential current voltage relationship and the small voltage changes between states are two important factors that contribute to the very high switching speed of the gate 16.

In addition, the input voltage is precisely clamped and the exact magnitude of the currents $I_4$ and $I_6$ is not critical. In this input low state these currents need only be small with respect to current $I_1$, and nonzero to ensure that transistor 54 remains slightly conductive so that its current conduction can be rapidly increased without minority carrier transit time delays. The currents $I_4$ and $I_6$ could be doubled or halved with respect to their average values and these conditions would still be met. The individual output currents $I_3$ will also vary with the number of outputs that are connected to succeeding stages. If no outputs are connected $I_5$ will equal $I_6$, but if at least one output is connected to the input of any succeeding stages the input to the succeeding stage will clamp the collector of transistor 54 at about 0.600 volt less $V_A$ and diodes 58 and 60 will be rendered nearly nonconductive. However, because they are Schottky diodes, their subsequent turn-on can be rapid. Current $I_6$ will divide between the current $I_3$ of connected stages. Thus, each of the currents $I_3$ is much much smaller than current $I_1$, when transistor 54 is in a low conduction state. Each current $I_3$ must be small enough that changes that may occur therein have no appreciable effect upon the operation of the succeeding stage. The voltage clamping of the input 26 at about 0.467 volt and the current source regulation of transistors 52 and 54 assure that this will be the case.

As previously explained, when the input 26 is high and the outputs 28 are low, current $I_2$ is finite but small with respect to current $I_1$. In this condition almost all of $I_1$ divides between $I_4$ and $I_5$ with diodes 58 and 60 conducting to provide a negative feedback path to clamp the collector of transistor 54 (and thereby clamp each of the three outputs) and to regulate the base emitter voltage of transistors 52 and 54.

As an example, assume that $I_1$ is 101 $\mu A$, $I_2$ is 1 $\mu A$ and $I_6$ is five times $I_4$. Using convenient approximations then, if one output is connected $I_6$ will be about 166 $\mu A$, $I_4$ will be about 33 $\mu A$ and $I_5$ will be about 66 $\mu A$. Because of the exponential voltage-current relationship across the base-emitter junction of a transistor, a two to one range of $I_4$ results in only a 20 millivolt change in the base emitter voltage of transistors 52 and 54 and also in the outputs 28. For example, a range of 0.600 to 0.620 volt in the input 26 voltage would result in a 0.467–0.487 volt range for the outputs 28. This clamps the input of the succeeding stage sufficiently constant that $I_6$ of the succeeding stage varies through only a two to one range such as 0.75 $\mu A$ to 1.5 $\mu A$. This represents a change of only 0.75% with respect to $I_1$ 101 $\mu A$ and the next successive stage would not be significantly affected. Any changes in the input high voltage due to variations in the current gain of transistors 52 and 54 or the magnitude of $I_1$ would similarly be reduced in significance by the exponential voltage current relationship of the base-emitter junctions of transistors 52 and 54. It is thus apparent that any deviation from nominal operating conditions at a given stage are reduced and stabilized rather than amplified at succeeding stages.

If the output of an inverter gate 14 preceding the inverter gate 16 shown in FIG. 2 and which is connected to input conductor 26 is driven conductive, current $I_2$ will assume a large magnitude approximately equal to, but slightly less than $I_1$ as input conductor 26 is driven to a voltage $V_{PN}$ −0.133 and clamped thereat by the output of the preceding inverter gate. Because of the non-linear, logarithmic voltage-current relationship of the PN junctions of transistor 54 as the input 26 varies between the different high and low binary logic state voltage magnitudes, this base emitter voltage reduction will reduce the emitter current of transistor 54 by a factor of approximately 128. Thus, while transistor 54 will not be completely turned off, it will conduct at such a low current level that a current $I_2$ in a subsequent stage connected to one of the outputs 28 will be relatively small in comparison to the input current $I_1$ of the subsequent stage and the current $I_1$ of the subsequent stage will drive the output 28 of the illustrated inverter gate as well as the input of the subsequent inverter gate to the higher voltage logic level $V_{PN}$. Logic inversion is thus obtained across the logic gate illustrated in FIG. 2. It will be appreciated that each of the inverter gates 16 shown in FIG. 1 may be substantially identical and may be operated in a substantially identical manner.

One possible representation of the input buffers 14 is illustrated by way of example in FIG. 3. It should be appreciated that the purpose of the input buffer is to accept logic signals with sufficiently low switching speeds and sufficiently high voltage noise margins to permit interchip communication. The input buffer 14 may be of a type which is compatible with one or more of the standard TTL or ECL logic circuits or any other logic circuit with sufficient noise immunity for interchip communication. The circuit shown in FIG. 3 is a typical Schottky TTL type of input circuit. It includes a Schottky transistor 70 having an emitter 72 coupled to the cathode of a Schottky diode 74 and to the data input terminal or conductor. Although only one data input is provided for each input buffer 14, it should be appreciated that additional inputs may be readily provided and automatically logically ANDed by the input buffer 14 by merely providing additional emitters 76 for transistor 70 and additional Schottky diodes 78 for each additional input as indicated in phantom outline.

A suggested output buffer 18 is illustrated by way of example in FIG. 4. As with the input buffer 14, the output buffer 18 may assume any suitable configuration which would provide sufficient noise immunity for interchip communication. Except for the use of an MOS-FET "P" channel transistor 84 which may be identical to the transistor 50 as shown in FIG. 2, the output buffer 18 is typical of Schottky TTL totem pole output logic circuitry. The current source 84 is connected to the input conductor 30 of the output buffer 18 and insures that the current level at the input to the output buffer is compatible with the current levels at the inputs to the inverter gates 16 and thus compatible with the current sinking capabilities of the outputs 28 of the inverter gates 16.

As illustrated in FIGS. 5 and 6, the individual inverter gates 16 of the array 12 may be selectively interconnected during a metalization stage of manufacture to form any desired logic pattern that is consistent with the number of available gates. As illustrated in FIG. 5, a NAND gate may be implemented by merely wire ANDing as many inputs as desired at the input conductor 88 of a selected inverter gate 90, to produce a desired output logic function $F_1$. Similarly, as illustrated in FIG. 6, a NOR gate may be fabricated by merely wire ANDing the outputs of two different inverter gates 92, 94 by direct connection of one output from each of the gates 92, 94 to make an output logic function $F_2$ available at the connected outputs. A latch may of course be formed as illustrated in FIG. 7 by cross-coupling an input and an output from each of a pair of inverter gates 96, 98. Additional logic circuitry may then be coupled to selectively control a latch to form a standard flip-flop.

While a particular embodiment of a differential Schottky clamped logic circuit for an uncommitted gate array in accordance with the invention has been disclosed for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

What is claimed is:

1. A logic inverter gate having an input with an input voltge thereat and an output with an output voltage thereat, the gate output conducting a current which varies nonlinearly as the input voltage varies between different first and second magnitudes, the gate including a first semiconductor junction having a given forward biased voltage drop, a second semiconductor junction different from the first junction and having a forward biased voltage drop different from the first junction and circuitry coupling the first and second junctions between the input and the output of the gate to establish a first voltage limit beyond which the gate input voltage cannot go and a second voltage limit different from the first limit beyond which the gate output voltage cannot go whenever the gate input is at the first voltage limit, the difference between the first and second voltage limits being controlled in accordance with the difference between the forward biased voltage drops of the first and second semiconductor junctions.

2. First and second logic inverter gates, each having an input and an output, each gate being comprised entirely of a single current source and a plurality of semiconductor junctions coupled to receive current from the source, to limit the input to a first voltage of different first and second voltages indicating different binary logic states, and to limit the gate output to the second voltage in response to the occurrence of the first voltage at the gate input, the input of the second gate being connected to the output of the first gate with the voltage at the connection of the first gate output and second gate input being constrained between the first and second voltages.

3. A current controlled logic inverter gate having a gate input, a gate output, a continuously conducting junction transistor coupled to the gate input and to the gate output to provide current conduction ratios of at least approximately 100:1 at the gate output as the gate input varies between a first voltage and second voltage less than the first voltage indicating different first and second logic states respectively, and a limiting circuit coupled to limit the input to a maximum voltage no greater than said first voltage and, when the input is at said first voltage, to limit the output to a maximum voltage no greater than said second voltage.

4. A logic inverter gate having an input and an output that conducts a current which varies nonlinearly as input voltage varies between different first and second magnitudes representing different first and second logic states respectively and including means for limiting the output at the second voltage magnitude when the input is at the first voltage magnitude, means for limiting the input at the first voltage magnitude and a source of current having an output coupled to the gate input and tending to maintain the gate input voltage greater than both the first and second magnitudes, the current from the source remaining substantially constant notwithstanding variations in the input voltage between the first and second magnitudes, the limiting of the gate input and output voltages being effective to constrain the gate input voltage between the first and second voltages when the gate input is connected to a gate output of an additional, identical logic gate and to constrain the gate output voltage between the first and second voltages when the gate output is connected to a gate input of an additional, identical logic gate.

5. The logic inverter gate according to claim 4 above, wherein the difference between the first and second voltage magnitudes is not more than 0.133 volt and the ratio of current conducted at the gate output as the input voltage changes between the first and second voltage magnitudes is at least 100 to 1.

6. The logic inverter gate according to claim 5 above, wherein the means for limiting the output includes an NPN bipolar transistor having a base coupled to the input and a collector coupled to the output.

7. The logic inverter gate according to claim 6 above, wherein the means for limiting the input includes a second NPN bipolar transistor having a base and collector coupled to the input and an emitter directly connected to an emitter of the before-mentioned transistor.

8. The logic inverter gate according to claim 7 above, wherein the means for limiting the output includes a first type of Schottky diode having a first forward conduction voltage threshold coupled to conduct current from the current source to the input, a first type of Schottky diode and a second type of Schottky diode having a second forward conduction voltage threshold greater than the first threshold coupled in series to conduct current from the source to the collector of the first-mentioned transistor and a first type of Schottky diode coupled to conduct current from the output to the collector of the first-mentioned transistor.

9. A current controlled digital logic inverter gate comprising:
 a gate input conductor;
 at least one gate output conductor;
 a source of current coupled to provide current of a first magnitude therefrom to the input conductor and to a current control circuit;

a controllable conductor of current coupled to provide current at each output conductor of a polarity tending to conduct current away from the output conductor;

the current control circuit operating in response to current flow through the input conductor to control the magnitude of current provided by the controllable conductor of current to cause the controllable conductor of current to provide a magnitude of current at least approximately equal to the first magnitude when the current through the input conductor has a second magnitude smaller than the first magnitude and to provide a nonzero magnitude of current approximately equal to the second magnitude when the current through the input conductor has a third magnitude less than the first magnitude and greater than the second magnitude, the current control circuit being coupled to control the controllable conductor of current in response to a second current magnitude at the gate input to limit a voltage at each output conductor at a maximum magnitude at which the magnitude of current through the input conductor approximately equals the third magnitude when the input conductor is at the same voltage as the limited output voltage magnitude.

10. A current controlled digital logic inverter gate according to claim 9 above, wherein the current control circuit includes circuitry limiting the input conductor at a maximum input voltage magnitude greater than the maximum voltage magnitude at which each output voltage is limited.

11. A current controlled digital logic inverter gate according to claim 10 above, wherein the difference between the input maximum voltage magnitude and output maximum voltage magnitude is less than 0.5 volt.

12. A current controlled digital logic inverter gate according to claim 10 above, wherein the difference between the input maximum voltage magnitude and output maximum voltage magnitude is not more than approximately 0.133 volt.

13. A current controlled digital logic inverter gate according to claim 10 above, wherein the current control circuit includes two different types of Schottky diodes with the difference between the input maximum voltage magnitude and output maximum voltage magnitude being determined by a difference in forward biased voltage drops across the two different types of Schottky diodes.

14. A current controlled digital logic inverter gate according to claim 13 above, wherein the controllable conductor of current comprises exactly one transistor which is of the bipolar type and has a base terminal and an emitter terminal connected across the input voltage and a collector terminal coupled to the at least one output conductor.

15. A current controlled digital logic inverter gate according to claim 14 above, wherein the current control circuit operates to divert current from the base to the collector of the transistor of the controllable conductor of current when the voltage at an output conductor becomes less than the output maximum voltage magnitude to tend to reduce the current through the collector of the transistor.

16. A current controlled digital logic inverter gate according to claim 13 above, wherein the two different types of Schottky diodes are an aluminum Schottky diode and a platinum silicide Schottky diode.

17. A logic inverter gate comprising a gate input, at least one gate output, a transistor having a collector, a base and an emitter, a source of current coupled to the gate input and the transistor base and providing a magnitude of current that is divided between at least the gate input and the transistor base, a clamping circuit coupled to clamp the transistor base emitter voltage to prevent the base emitter voltage from exceeding a first voltage, and to clamp the transistor collector emitter voltage to prevent the collector emitter voltage from exceeding a second voltage less than the first voltage when the gate input current has a current magnitude less than or equal to a given current magnitude that is sufficiently less than the magnitude of the current from the source that the divided source current provided to the transistor base results in sufficient transistor collector current to reduce the transistor collector emitter voltage to said second voltage, means coupled between the collector and each gate output for clamping each gate output at a third voltage relative to the transistor emitter, the third voltage being a voltage at which a magnitude of current greater than said given current magnitude and less than the source current magnitude flows through the gate input when the gate input is at a voltage equal to the third voltage.

18. The logic inverter gate according to claim 17 above, wherein the clamping circuit includes different kinds of Schottky diodes and the difference between the first and third voltage is determined by the difference between the voltage drops across different kinds of the Schottky diodes when they are conducting current.

19. The logic inverter gate according to claim 17 above, wherein the first voltage does not saturate the transistor and some current flows through the transistor emitter when the gate input is at a voltage equal to the third voltage.

20. The logic inverter gate according to claim 18 above, wherein the different kinds of Schottky diodes include an aluminum Schottky diode and a platinum silicide Schottky diode.

21. An uncommitted gate array comprising:
a plurality of input buffer circuits fabricated on a single chip;
a plurality of output buffer circuits fabricated on said single chip; and
a plurality of logic gates fabricated on said single chip, the logic gates having input conductors and output conductors which are connectable between the plurality of input buffers and the plurality of output buffers, each of the logic gates including
an input conductor,
an output conductor,
a current source,
a first transistor coupled to conduct current provided by the current source, the first transistor having a first collector, a first base coupled to the first collector and to the input conductor, and an emitter coupled to a first fixed voltage,
a second transistor coupled to conduct current provided by the current source and current available at the logic gate output conductor, the second transistor having a second collector, a second base coupled to the first base, and a second emitter coupled to a second fixed voltage, the second transistor being selectively fabricated to conduct a current through the second emitter that is somewhat greater than a current being conducted through the first emitter when identical voltage drops exist across the base and emitter of the first and second transistors, a first type of Schottky diode coupled to conduct current provided by the current source to the first collector, a pair of Schottky diodes coupled in series to conduct current provided by the current source between the current source and the second collector, one of said pair being a second type of Schottky diode different from the first type and the other of said pair being a second first type of Schottky diode, an additional first type of Schottky diode coupled to conduct current therethrough between the output conductor and the second collector, with any current through the additional diode being conducted through the second transistor.

22. An integrated circuit current controlled logic inverter gate comprising:
a source of current;
a first diode coupled NPN bipolar transistor having a base and collector thereof connected together and forming a logic inverter gate input, the first transistor further having an emitter of predetermined area coupled to circuit ground;
a first type of Schottky diode connected to conduct current from the source of current to the connected base and collector of the first transistor;
a second NPN bipolar transistor having a base connected to the connected base and collector of the first transistor, a collector, and an emitter coupled to circuit ground, the second transistor being fabricated simultaneously with the first transistor with an identical process and with a selected emitter area greater than the emitter area of the first transistor to provide the second transistor with a desired N:1 emitter current ratio relative to the emitter current of the first transistor where N is greater than 1;
a second first type of Schottky diode and a second type of Schottky diode connected in series to conduct current from the source of current to the collector of the second transistor;
at least one additional Schottky diode, each being connected to conduct current from a different logic inverter gate output to the collector of the second transistor, each additional Schottky diode having a forward biased voltage drop less than a forward biased voltage drop of the second type of Schottky diode.

23. The logic inverter gate according to claim 22 above, wherein the source of current is an FET transistor having a drain connected to a positive voltage supply, a source connected to the first type of Schottky diode and the series connected second first type of Schottky diode and second type of Schottky diode, and a gate coupled to circuit ground.

24. The logic inverter gate according to claim 22 above, wherein each additional Schottky diode is the same type as the first type of Schottky diode.

25. The logic inverter gate according to claim 24 above, wherein the first type of Schottky diode is an aluminum Schottky diode and the second type of Schottky diode is a platinum silicide Schottky diode.

26. The logic inverter gate according to claim 22 above, wherein there are at least three of said additional diodes connected between at least three different inverter gate outputs and the collector of the second transistor and wherein N is at least 7.

27. A logic gate array comprising:
at least one input buffer circuit;
at least one output buffer circuit;
at least one logic gate coupled in a selected one of a plurality of possible configurations between at least one input buffer circuit and at least one output buffer circuit, each of the at least one logic gate including:
a current source providing a current of a first magnitude,
a first diode coupled to conduct current between the current source and a fixed voltage,
a second diode of a first type coupled in series between the current source and said first diode, a logic gate input being formed at a point of coupling between the first and second diodes,
a transistor having a collector, an emitter and a base coupled to the logic gate input, the transistor being fabricated to conduct a current greater than the first magnitude when the current through the logic gate input is much smaller than the first magnitude and a current much smaller than the first magnitude when a current substantially equal to the first magnitude flows through the logic gate input,
a pair of diodes coupled in series to conduct current between the current source and the collector, one of said pair being of the first type and the other being of a second type having a forward biased junction voltage greater than a forward biased junction voltage of the first type,
at least one additional first type of diode each coupled between a different logic circuit output and the collector.

28. A digital logic gate array for fabrication as a single chip integrated circuit comprising:
a plurality of logic input conductors;
a plurality of logic output conductors;
a plurality of digital output buffer circuits fabricated on the single chip, each driving a different logic output conductor in response to an input provided by the output of a small differential voltage current mode digital logic gate with a digital logic signal suitable for coupling to circuitry on a different chip; and,
a plurality of said current mode digital logic gates fabricated on a single chip and operating between voltage changes of less than 0.5 volts at different logic states, each digital logic gate including a gate input conductor, a gate output conductor, a source of current of a first magnitude coupled to provide current to the gate input conductor and to a current control circuit, a controllable conductor of current coupled to provide current to the gate output conductor, and said current control circuit, the current control circuit being responsive to current from the first current source and current at the gate input conductor to control the current through the controllable conductor of current at a magnitude greater than the first magnitude when the magnitude of current through the gate input conductor is substantially less than the first magnitude and at a magnitude substantially less than the first magnitude when the magnitude of current through the gate input conductor is approximately equal to the first magnitude.

29. The digital logic gate array according to claim 28 above, wherein the current control circuit includes voltage clamping circuitry clamping the voltage at the gate input conductor at a selected maximum first voltage and also selectively clamping the voltage at the gate output conductor at a selected maximum second voltage which is less than the first voltage, the input conductor of a logic gate being selectively clamped at a maximum second voltage by connection to an output conductor of a similar logic gate and the output conductor of a logic gate being clamped at a maximum first voltage by connection to an input conductor of a similar logic gate.

30. A logic inverter gate having an input with an input voltage thereat and at least one output that conducts a current which varies nonlinearly as the input voltage varies between different first and second magnitudes, the gate including a first semiconductor junction having a given forward biased voltage drop; a second semiconductor junction different from the first junction and having a forward biased voltage drop different from the first junction; a third semiconductor junction; first and second bipolar transistors; and circuitry coupling the first, second and third junctions and the first and second transistors between the input and the at least one output of the gate to limit the at least one gate output voltage to the second magnitude in response to a first magnitude of voltage at the gate input, the difference between the first and second magnitudes being equal to and determined by the difference between the forward biased voltage drops of the first and second semiconductor junctions, said first transistor having an emitter, a base, and a collector coupled to conduct current from the input toward ground when the gate input voltage exceeds the first magnitude, said third semiconductor junction being coupled between a gate output and a collector of the second bipolar transistor having a base, an emitter and a collector, and the second transistor having a base emitter junction coupled between the gate input and ground.

31. The logic inverter gate according to claim 30 above, further comprising a current source coupled to provide a current to the gate input.

32. The logic inverter gate according to claim 31 above, wherein said second semiconductor junction is a Schottky diode junction.

33. A current controlled logic inverter gate having a gate input, a gate output, a continuously conducting junction transistor coupled to the gate input and to the gate output to provide current conduction ratios of at least approximately 100:1 at the gate outputs as the gate input varies between first and second voltages representing different first and second logic states respectively, and a clamping circuit coupled to clamp the input to prevent the input voltage from going beyond said first voltage and to clamp the output to prevent the output voltage from going beyond said second voltage when the input is at said first voltage, the clamping circuit including a second junction transistor having a collector and emitter coupled between the gate input and ground and a base responsively coupled to the gate input voltage to cause the emitter and collector to conduct an increasing magnitude of current from the gate input toward ground as the voltage at the gate input increases beyond said first voltage.

* * * * *

UNITED STATES PATENT AND TRADEMARK OFFICE
CERTIFICATE OF CORRECTION

PATENT NO. : 4,239,981
DATED : December 16, 1980
INVENTOR(S) : Rex J. Crookshanks It is certified that error appears in the above-identified patent and that said Letters Patent are hereby corrected as shown below:

Column 6, line 38, after "clamps" and before "the" (second occurrence), insert --(limits)--; line 39, before "voltage", "maxium" should read --maximum--. Column 7, line 37, after "succeeding", "stages" should read --stage--. Column 8, line 5, after "$I_1$" and before "101", insert -- = --. Column 9, line 38, before "thereat", "voltge" should read --voltage--.

Signed and Sealed this

Nineteenth Day of May 1981

[SEAL]

Attest:

RENE D. TEGTMEYER

*Attesting Officer*   *Acting Commissioner of Patents and Trademarks*